(12) United States Patent
Chan et al.

(10) Patent No.: US 8,236,660 B2
(45) Date of Patent: Aug. 7, 2012

(54) MONOLAYER DOPANT EMBEDDED STRESSOR FOR ADVANCED CMOS

(75) Inventors: Kevin K. Chan, Staten Island, NY (US); Abhishek Dube, Fishkill, NY (US); Judson R. Holt, Wappingers Falls, NY (US); Jinghong Li, Poughquag, NY (US); Joseph S. Newbury, Irvington, NY (US); Viorel Ontalus, Danbury, CT (US); Dae-Gyu Park, Poughquag, NY (US); Zhengmao Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 12/764,329

(22) Filed: Apr. 21, 2010

(65) Prior Publication Data
US 2011/0260213 A1 Oct. 27, 2011

(51) Int. Cl.
*H01L 21/336* (2006.01)
(52) U.S. Cl. ........... 438/301; 438/289; 257/E21.562; 257/E21.619; 257/E21.634
(58) Field of Classification Search .......... 438/222, 438/226, 289, 300, 301; 257/E21.562, E21.618, 257/E21.619, E21.633, E21.634
See application file for complete search history.

(56) References Cited

U.S. PATENT DOCUMENTS

| | | | |
|---|---|---|---|
| 7,023,055 B2 | 4/2006 | Ieong et al. | |
| 7,329,923 B2 | 2/2008 | Doris et al. | |
| 7,413,961 B2 | 8/2008 | Chong et al. | |
| 7,446,005 B2 * | 11/2008 | Messenger et al. | 438/300 |
| 7,446,026 B2 | 11/2008 | Zhang et al. | |
| 7,494,884 B2 | 2/2009 | Lin et al. | |
| 2005/0116290 A1 | 6/2005 | de Souza et al. | |

(Continued)

OTHER PUBLICATIONS

Ang, K. W., et al., "Enhanced performance in 50 nm N-MOSFETs with silicon-carbon source/drain regions", IEEE International Electron Devices Meeting 2004, pp. 1069-1071, Piscataway NJ.

(Continued)

*Primary Examiner* — Matthew E Warren
(74) *Attorney, Agent, or Firm* — Scully, Scott, Murphy & Presser, P.C.; H. Daniel Schnurmann

(57) ABSTRACT

Semiconductor structures are disclosed that have embedded stressor elements therein. The disclosed structures include at least one FET gate stack located on an upper surface of a semiconductor substrate. The at least one FET gate stack includes source and drain extension regions located within the semiconductor substrate at a footprint of the at least one FET gate stack. A device channel is also present between the source and drain extension regions and beneath the at least one gate stack. The structure further includes embedded stressor elements located on opposite sides of the at least one FET gate stack and within the semiconductor substrate. Each of the embedded stressor elements includes a lower layer of a first epitaxy doped semiconductor material having a lattice constant that is different from a lattice constant of the semiconductor substrate and imparts a strain in the device channel, and an upper layer of a second epitaxy doped semiconductor material located atop the lower layer. The lower layer of the first epitaxy doped semiconductor material has a lower content of dopant as compared to the upper layer of the second epitaxy doped semiconductor material. The structure further includes at least one monolayer of dopant located within the upper layer of each of the embedded stressor elements. The at least one monolayer of dopant is in direct contact with an edge of either the source extension region or the drain extension region.

5 Claims, 3 Drawing Sheets

U.S. PATENT DOCUMENTS

| | | |
|---|---|---|
| 2006/0205189 A1 | 9/2006 | Messenger et al. |
| 2006/0234455 A1 | 10/2006 | Chen et al. |
| 2007/0026599 A1 | 2/2007 | Peidous et al. |
| 2007/0057287 A1 | 3/2007 | Lin et al. |
| 2007/0126036 A1 | 6/2007 | Ohta et al. |
| 2007/0132038 A1 | 6/2007 | Chong et al. |
| 2007/0138570 A1 | 6/2007 | Chong et al. |
| 2007/0173022 A1 | 7/2007 | Wang et al. |
| 2007/0184601 A1 | 8/2007 | Zhang et al. |
| 2007/0202641 A1 | 8/2007 | Wei et al. |
| 2007/0252204 A1 | 11/2007 | Wei et al. |
| 2008/0001182 A1 | 1/2008 | Chen et al. |
| 2008/0006818 A1 | 1/2008 | Luo et al. |
| 2008/0083948 A1 | 4/2008 | Lin et al. |
| 2008/0157200 A1 | 7/2008 | Kim et al. |
| 2008/0299724 A1 | 12/2008 | Grudowski et al. |
| 2009/0221119 A1 | 9/2009 | Grudowski et al. |
| 2009/0242989 A1 | 10/2009 | Chan et al. |

OTHER PUBLICATIONS

Chung, S. S., et al., "Design of high-performance and highly reliable nMOSFETs with embedded Si:C S/D extension stressor(Si:C S/D-E)", Symposium on VLSI Technology Digest of Technical Papers, 2009, pp. 158-159.

Liu, Y., et al., "Strained Si Channel MOSFETs with Embedded Silicon Carbon Formed by Solid Phase Epitaxy" VLSI Technology, 2007 IEEE Symposium, Jun. 12-14, 2007, pp. 44-45.

Ren, Z., et al., "On implementation of embedded phosphorus-doped SiC stressors in SOI nMOSFETs", VLSI Technology, 2008 Symposium, Jun. 17-19, 2008, pp. 172-173.

Wong, H.-S., et al., "Silicon-Carbon Stressors With High Substitutional Carbon Concentration and In Situ Doping Formed in Source/Drain Extensions of n-Channel Transistors", IEEE Electron Device Letters, 2008, pp. 460-463, vol. 29, No. 5.

Yang, B., et al., "High-performance nMOSFET with in-situ phosphorus-doped embedded Si:C (ISPD eSi:C) source-drain stressor", Electron Devices Meeting, 2008, IEDM 2008, IEEE International, Dec. 15-17, 2008, pp. 1-4.

International Search Report/Written Opinion, Sep. 1, 2012.

* cited by examiner

US 8,236,660 B2

MONOLAYER DOPANT EMBEDDED STRESSOR FOR ADVANCED CMOS

BACKGROUND

The present invention relates to a semiconductor structure and a method of fabricating the same. More particularly, the present invention relates to an embedded stressor element for re-channel field effect transistors (nFETs) and/or p-channel field effect transistors (pFETs) that provides low resistance, while being capable of retarding dopant out diffusion. The present invention also provides a method of fabricating semiconductor structures that include the embedded stressor element.

Mechanical stresses within a semiconductor device substrate have been widely used to modulate device performance such as, for example, drive current. For example, in common silicon technology, the channel of a transistor is oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in the film direction and/or under compressive stress in the direction normal of the channel. Therefore, compressive and/or tensile stresses can be advantageously created in the channel region of a p-channel field effect transistor (pFET) and/or an n-channel field effect transistor (nFET) in order to enhance the performance of such devices.

One possible approach for creating a desirable stressed silicon channel region is to form embedded SiGe or Si:C stressors (i.e., stress wells) within the source and drain regions of a complementary metal oxide semiconductor (CMOS) device to induce compressive or tensile strain in the channel region located between the source region and the drain region. For example, it has been demonstrated that hole mobility can be enhanced significantly in p-channel silicon transistors by using an embedded SiGe stressor in the source and drain regions. For re-channel silicon transistors, it has also been demonstrated that the electron mobility can be enhanced by using selective Si:C in which C is substitutional.

Current state of the art CMOS technologies rely on the activation and in-diffusion of source and drain dopants into the perimeter of the channel by high temperature processing steps, most commonly after embedded epitaxy and various ion implantation steps. Typically, a trade-off is reached between the sufficient dopant activation and minimized diffusion from the highly doped source and drain regions to form the active junctions. Mostly, the trade-off ends with a highly resistance junction which degrades transistor performance.

SUMMARY

The present disclosure provides an embedded stressor element for nFETs and/or pFETs in which the embedded stressor element has low resistance and mitigates the out-diffusion of dopants. The embedded stressor element of the present disclosure thus can be employed to tailor and locate the dopants within a FET. In some embodiments of the invention, a low contact resistance FET structure is provided by forming a semiconductor cap atop the embedded stressor element. The embedded stressor element of the present invention includes a monolayer of dopants, called Atomic Layer Dopants (ALDo), within an upper layer of the embedded stressor element that is in direct contact with the source and drain extension regions of the FET.

In one embodiment of the invention, a semiconductor structure is provided that includes at least one FET gate stack located on an upper surface of a semiconductor substrate. The at least one FET gate stack of the semiconductor structure includes a source extension region and a drain extension region located within the semiconductor substrate at a footprint of the at least one FET gate stack. A device channel is also present between the source extension region and the drain extension region and beneath the at least one gate stack. The structure further includes embedded stressor elements located on opposite sides of the at least one FET gate stack and within the semiconductor substrate. Each of the embedded stressor elements includes a lower layer of a first epitaxy doped semiconductor material having a lattice constant that is different from a lattice constant of the semiconductor substrate and imparts a strain in the device channel, and an upper layer of a second epitaxy doped semiconductor material located atop the lower layer. The lower layer of the first epitaxy doped semiconductor material has a lower content of dopant as compared to the upper layer of the second epitaxy doped semiconductor material. The structure further includes at least one monolayer of dopant located within the upper layer of each of the embedded stressor elements. The at least one monolayer of dopant is in direct contact with an edge of either the source extension region or the drain extension region to provide lower extension resistance.

In another embodiment of the invention, a CMOS structure is provided that includes at least one pFET gate stack and at least one nFET gate stack located on an upper surface of a semiconductor substrate. Each of the at least one pFET gate stack and the at least one nFET gate stack includes a source extension region and a drain extension region located within the semiconductor substrate at a footprint of both the at least one pFET gate stack and the at least one nFET gate stack. The structure further includes a device channel located between the source extension region and the drain extension region and beneath each of the gate stacks. pFET embedded stressor elements are located on opposite sides of the at least one pFET gate stack and within the semiconductor substrate, and nFET embedded stressor elements are located on opposite sides of the at least one nFET gate stack and within the semiconductor substrate. Each of the embedded stressor elements includes a lower layer of a first epitaxy doped semiconductor material having a lattice constant that is different from a lattice constant of the semiconductor substrate and imparts a strain in the device channel, and an upper layer of a second epitaxy doped semiconductor material located atop the lower layer. In the disclosed structure, the lower layer of the first epitaxy doped semiconductor material has a lower content of dopant as compared to the upper layer of the second epitaxy doped semiconductor material. The structure further includes at least one monolayer of dopant located within the upper layer of each of the embedded stressor elements. The at least one monolayer of dopant is in direct contact with an edge of either the source extension region or the drain extension region.

The present invention also provides a method of fabricating the above mentioned structures. The method includes forming at least one FET gate stack on an upper surface of a semiconductor substrate; forming a source extension region and a drain extension region within the semiconductor substrate at the footprint of the at least one FET gate stack; forming recessed regions on opposite sides of the at least one FET gate stack and within the semiconductor substrate; and forming embedded stressor elements substantially within the recessed regions, wherein each of the embedded stressor elements includes a lower layer of a first epitaxy doped semiconductor material having a lattice constant that is different from a lattice constant of the semiconductor substrate and imparts a strain in the device channel, an upper layer of a second epitaxy doped semiconductor material located atop the lower layer, wherein the lower layer of the first epitaxy doped semiconductor material has a lower content of dopant as compared to the upper layer of the second epitaxy doped semiconductor material, and at least one monolayer of dopant located within the upper layer, the at least one monolayer of dopant is in direct contact with an edge of either the source extension region or the drain extension region to lower source and drain resistance.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present invention will now be described in greater detail by referring to the following discussion and drawings that accompany the present application. The drawings of the present application, which are referred to herein below in greater detail, are provided for illustrative purposes and, as such, they are not drawn to scale.

Figure 1:
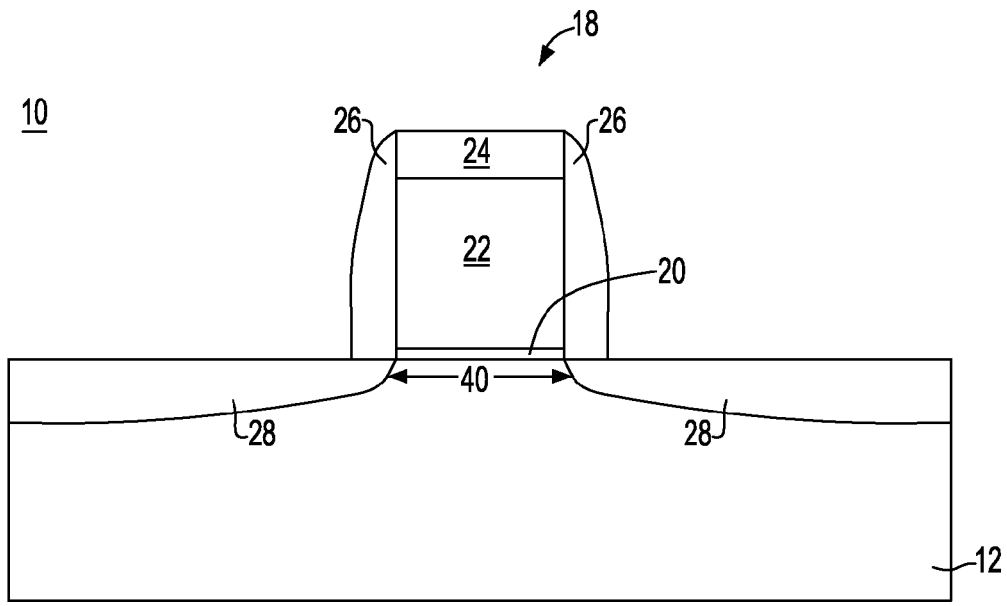
FIG. 1 is a pictorial representation (through a cross sectional view) depicting an initial structure including at least one FET gate stack located on an upper surface of a semiconductor substrate that can be employed in one embodiment of the invention.

Reference is first made to FIG. 1 which illustrates an initial structure 10 that can be employed in one embodiment of the present invention. The initial structure 10 includes a semiconductor substrate 12 including at least one FET device region 14. A second device region (not shown) can be formed to the periphery of the at least one FET device region 14 that is shown in FIG. 1. The semiconductor substrate 12 can also include at least one isolation region (not specifically shown). The initial structure 10 further includes at least one FET gate stack 18 located on an upper surface of the at least one device region 14 of the semiconductor substrate 12. In the drawings, a single FET gate stack is shown for illustrative purposes only.

The at least one FET gate stack 18 employed in the present invention can include at least one pFET gate stack, at least one nFET gate stack or a combination of at least one pFET gate stack and at least one nFET gate stack that are located on different device regions of the semiconductor substrate 12. When a combination of nFET gate stacks and pFET gate stacks are employed, an isolation region is typically present between the device regions that include the different polarity devices.

The at least one FET gate stack 18, which is typically patterned, includes, from bottom to top, a gate dielectric 20, a gate electrode 22 and an optional gate electrode cap 24; gate electrode cap 24 can also be referred to herein as a dielectric cap. At least one spacer 26 (which can be referred to as an inner spacer) is typically located on the sidewalls of each of the FET gate stacks that are present in the initial structure 10. In some embodiments, no spacer 26 is present.

The initial structure 10 shown in FIG. 1 can be formed by conventional methods and include materials well known to those skilled in the art. For example, the semiconductor substrate 12 of the initial structure 10 can be comprised of any semiconductor material including, but not limited to Si, Ge, SiGe, SiC, SiGeC, GaAs, GaN, InAs, InP and all other III/V or II/VI compound semiconductors. The semiconductor material of the semiconductor substrate 12 has a lattice constant that is dependent on the type of semiconductor material employed. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In one embodiment of the invention, the semiconductor substrate 12 includes an SOI substrate in which top and bottom semiconductor material layers such as Si are spaced apart by a buried dielectric such as a buried oxide. In a preferred embodiment of the present invention, the semiconductor substrate 12 is composed of bulk silicon or a silicon-on-insulator. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a {100} crystal surface, while a pFET is typically formed on a {110} crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The at least one isolation region (not specifically shown) is typically formed into the semiconductor substrate 12 so as to form device regions within the semiconductor substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The height of the trench isolation region can be adjusted by performing a wet etching process such as etching with a solution containing hydrofluoric acid. The field oxide can be formed utilizing a so-called local oxidation of silicon process.

The various device regions may be doped (e.g., by ion implantation processes) to form well regions within the different device regions. For clarity, the well regions are not specifically shown in the drawings of the present application. The well regions for pFET devices typically include an n-type dopant, and the well regions for nFET devices typically include a p-type dopant. The dopant concentration of the well regions of the same conductivity type device may be the same or different. Likewise, the dopant concentration of the well regions of the different conductivity type may be the same or different.

After processing the semiconductor substrate 12, the at least one FET gate stack 18 is formed utilizing any conventional process that is well known to those skilled in the art. In embodiments in which nFET and pFET gate stacks are both present, a first polarity FET gate stack (either nFET or pFET) can be formed before, during or after forming a second polarity FET gate stack (either pFET or nFET not used as the first polarity FET gate stack). It is observed that although FIG. 1 as well as FIGS. 2-5 show the presence of a single FET device region 14 and a single FET gate stack, the present invention can also be practiced when more than one device region is present and/or with a different number of FET gate stacks 18. When more than one gate stack is present, the different gate stacks can have the same or different gate dielectrics and/or gate electrode materials. Different gate dielectric and gate electrode materials can be obtained utilizing block masks to block formation of one type of material from one region, while forming the material in another region not including the block mask. When more than one gate stack is provided, the gate stacks can be used in forming a FET of the same or different conductivity type.

In one embodiment, the at least one FET gate stack 18 is formed by deposition of various material layers, followed by patterning the deposited material layers via lithography and etching. In another embodiment of the present invention, the at least one FET gate stack 18 is formed by a replacement gate process that includes the use of a dummy gate material.

Notwithstanding the technique used in forming the at least one FET gate stack 18, the at least one FET gate stack 18 includes, from bottom to top, a gate dielectric 20, a gate electrode 22, and an optional gate electrode cap 24.

The gate dielectric 20 includes any gate insulating material such as for example, an oxide, a nitride, an oxynitride or a multilayered stack thereof. In one embodiment of the invention, the gate dielectric 20 is a semiconductor oxide, a semiconductor nitride or a semiconductor oxynitride. In another embodiment of the invention, the gate dielectric 20 includes a dielectric metal oxide having a dielectric constant that is greater than the dielectric constant of silicon oxide, e.g., 3.9. Typically, the gate dielectric 20 that is employed has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 20. Each value of x is independently from 0.5 to 3 and each value of y is independently from 0 to 2.

The thickness of the gate dielectric 20 may vary depending on the technique used to form the same. Typically, the gate dielectric 20 has a thickness from 1 nm to 10 nm, with a thickness from 2 nm to 5 nm being more typical. When a high k gate dielectric is employed as the gate dielectric 20, the high k gate dielectric can have an effective oxide thickness on the order of, or less than, 1 nm.

The gate dielectric 20 can be formed by methods well known in the art. In one embodiment of the invention, the gate dielectric 20 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the gate dielectric 20 can be formed by a thermal process such as, for example, thermal oxidation and/or thermal nitridation.

The gate electrode 22 comprises any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate electrode 22 is comprised of an nFET metal gate. In another embodiment, the gate electrode 22 is comprised of a pFET metal gate. In a further embodiment, the gate electrode 22 is comprised of polycrystalline silicon. The polysilicon gate can be used alone, or in conjunction with another conductive material such as, for example, a metal gate electrode material and/or a metal silicide gate electrode material.

The gate electrode 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate electrode 22, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as-deposited gate electrode 22 typically has a thickness from 10 nm to 100 nm, with a thickness from 20 nm to 50 nm being even more typical.

In some embodiments of the invention, optional gate electrode cap 24 can be formed atop the gate electrode 22. The optional gate electrode cap 24 includes a dielectric oxide, nitride, oxynitride or any combination thereof including multilayered stacks. In one embodiment, the optional dielectric electrode cap 24 is comprised of silicon nitride. When the optional gate electrode cap 24 is present, the optional gate electrode cap 24 is formed utilizing a conventional deposition process well known to those skilled in the art including, for example, CVD and PECVD. Alternatively, the optional gate electrode cap 24 can be formed by a thermal process such as, for example, oxidation and/or nitridation. The thickness of the optional gate electrode cap 24 may vary depending on the exact cap material employed as well as the process that is used in forming the same. Typically, the optional gate electrode cap 24 has a thickness from 5 nm to 200 nm, with a thickness from 10 nm to 50 nm being more typical. The optional gate electrode cap 24 is typically employed when the gate electrode 22 is composed of a Si-containing material such as polysilicon.

The initial structure 10 shown in FIG. 1 can also include at least one spacer 26 whose base is located on an upper surface of the semiconductor substrate 12. An edge of the at least one spacer 26 is located on a sidewall of the at least one FET gate stack 18. The at least one spacer 26 includes any dielectric material such as, for example, an oxide, a nitride, an oxynitride or any combination thereof. Typically, but not necessarily always, the at least one spacer 26 is comprised of a different material than the optional gate electrode cap 24. In one embodiment, the at least one spacer 26 is comprised of silicon oxide or silicon nitride. In another embodiment, the at least one spacer 26 includes a thin inner spacer, and a wider (relative to the inner spacer) outer spacer. In such an embodiment, the thin inner spacer can be comprised of silicon oxide, while the wider outer spacer can be comprised of silicon nitride.

The at least one spacer 26 can be formed utilizing processes that are well known to those skilled in the art. For example, the at least one spacer 26 can be formed by deposition of the spacer material, followed by etching. The width of the at least one spacer 26, as measured at its base, is typically from 2 nm to 50 nm, with a width, as measured at its base, from 5 nm to 15 nm being more typical.

The initial structure 10 shown in FIG. 1 further includes extension regions 28 that are located within the semiconductor substrate 12 at the footprint of each of the FET gate stacks. In FIG. 1, one of the regions labeled as 28 is a source extension region, while the other region labeled as 28 is a drain extension region. The extension regions 28 can be formed into the semiconductor substrate 12 utilizing an extension ion implantation process that is well known to those skilled in the art. The at least one FET gate stack 18 and, if present, the at least one spacer 26, serve as an implantation mask during the extension ion implant process in the FET device region 14.

After implanting the extension regions 28, an anneal can be used to activate the extension regions 28. The anneal, which can be performed any time after the ion implantation step, is typically performed at a temperature greater than 800° C., with a temperature of greater than 850° C. being more typical. The anneal can be performed utilizing any conventional anneal process. Examples of anneals that can be employed include, for example, a rapid thermal anneal, a furnace anneal, a laser anneal, a microwave anneal, or a combination of those techniques. The duration of the anneal, i.e., the annealing time, may vary depending on the exact anneal process utilized as well as the temperature of the anneal. Typically, the anneal is performed for a time period of 10 minutes or less. The anneal is typically performed in an inert ambient such as, for example, helium, nitrogen, and/or argon. In some embodiments, the annealing can be performed utilizing a forming gas (a mix of hydrogen and nitrogen).

It is observed that the portion of the semiconductor substrate 12 that is located beneath the at least one FET gate stack 18 which is bounded by the extension regions 28 is the device channel 40.

In some embodiments of the present invention, an optional halo implant is performed that forms optional halo regions (not shown) within the semiconductor substrate 12 of the initial structure 10. The optional halo implant can be performed utilizing any conventional halo implant, such as an angled halo ion implant, that is well known to those skilled in the art. After the optional halo implant, an optional halo activation anneal is typically performed at a temperature of 1350° C. or less. In one embodiment, the optional halo activation anneal can include a laser anneal or rapid thermal anneal.

Figure 2:
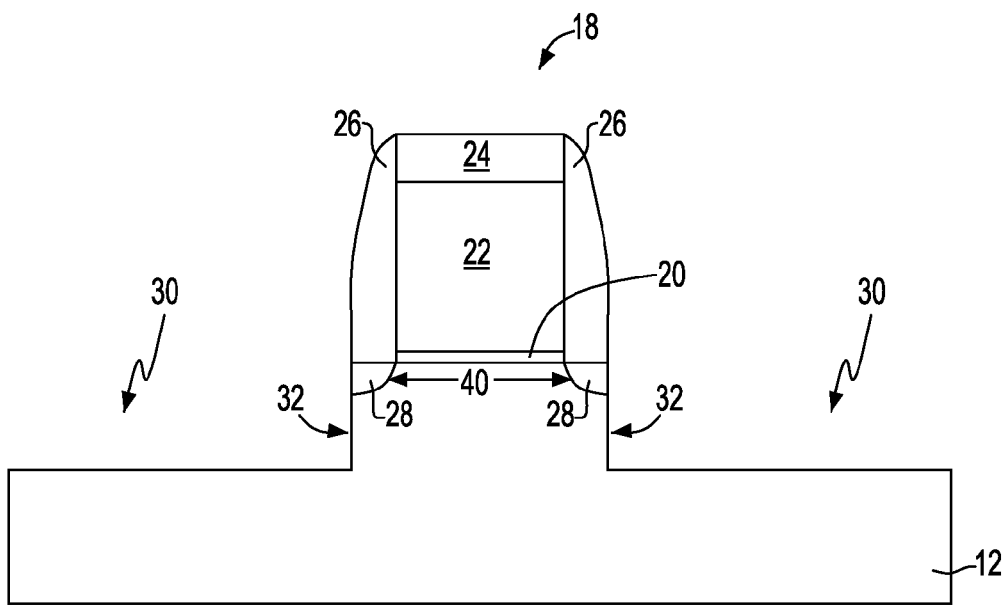
FIG. 2 is a pictorial representation (through a cross sectional view) depicting the structure of FIG. 1 after forming recessed regions within the semiconductor substrate which are located at the footprint of the at least one FET gate stack.

Referring to FIG. 2, there is shown the structure of FIG. 1 after forming recessed regions 30 within the semiconductor substrate 12 at the footprint of the at least one FET gate stack 18. The recessed regions 30 are formed on opposite sides of the FET gate stack as shown in FIG. 2; one the recessed regions 30 can be referred to as a source trench, while the other recessed region can be referred to as a drain trench. The recessed regions 30, e.g., trenches, are formed utilizing an etching technique that is well known to those skilled in the art. The at least one FET gate stack 18, and if present, the at least one spacer 26 serve as an etch mask during the etching process. The etching process selectively removes exposed portions of the semiconductor substrate 12 that are not protected by the at least one FET gate stack 18 and, if present, the at least one spacer 26. The depth of each of the recessed regions 30, as measured from the top surface of the substrate 12 to the bottom of the recessed region 30, is typically from 20 nm to 150 nm, with from 30 nm to 70 nm being more typical.

The etching that can be used in forming each of the recessed regions 30 includes wet etching, dry etching or a combination of wet and dry etching. In one embodiment, an anisotropic etch is employed in forming each of the recessed regions 30. In another embodiment, an isotropic etch is employed in forming each of the recessed regions 30. In a further embodiment, a combination of anisotropic etching and isotropic etching can be employed in forming each of the recessed regions 30. When a dry etch is employed in forming each of the recessed regions 30, the dry etch can include one of reactive ion etching (RIE), plasma etching, ion beam etching and laser ablation. When a wet etch is employed in forming each of the recessed regions 30, the wet etch includes any chemical etchant, such as, for example, ammonium hydroxide that selectively etches the exposed FET device region 14 of the semiconductor substrate 12. In some embodiments, a crystallographic etching process can be used in forming each of the recessed regions 30.

In the embodiment illustrated in FIG. 2, the etching provides recessed regions 30 within the semiconductor substrate 12 that have substantially straight sidewalls 32. The substantially straight sidewalls 32 may have some taper.

In an alternative embodiment (not shown), a structure can be formed having faceted recessed regions. The alternative structure can be formed utilizing a dry etching process, followed by a lateral wet etching process. The lateral wet etch process can include, for example, ammonium hydroxide.

Figure 3:
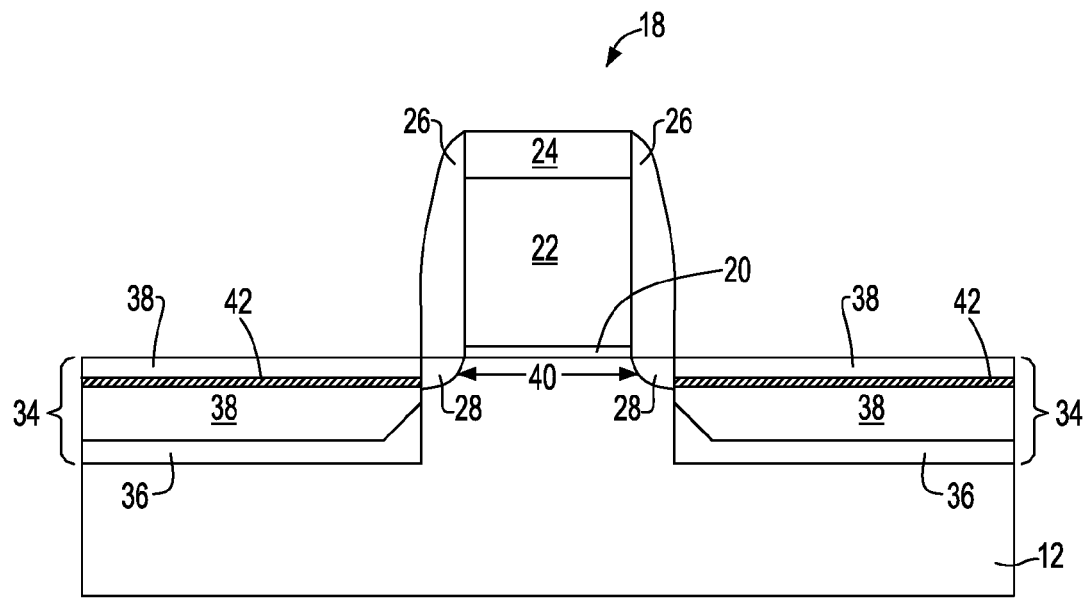
FIG. 3 is a pictorial representation (through a cross sectional view) depicting the structure of FIG. 2 after filling each of the recessed regions with an embedded stressor element that includes a lower layer of a first epitaxy doped semiconductor material, and an upper layer of a second epitaxy doped semiconductor material, wherein at least the upper layer of the second epitaxy doped semiconductor material includes at least one monolayer of dopant that is in direct contact with an edge portion of the source/drain extensions of the at least one FET gate stack.

Referring to FIG. 3, there is shown the structure of FIG. 2 after forming embedded stressor elements 34 within each of the recessed regions 30. Each of the embedded stressor elements 34 includes a lower layer 36 of a first epitaxy doped semiconductor material and an upper layer 38 of a second epitaxy doped semiconductor material. At least the upper layer 38 of each of the embedded stressor elements formed includes at least one monolayer 42 of an n-type or p-type dopant therein that is direct contact with an edge portion of one of the source/drain extensions region 28 of the FET gate stack 18. In some embodiments of the invention, the lower layer 36 of each of the embedded stressor elements 34 may also include at least one monolayer of an n-type or p-type dopant therein. This particular embodiment is not shown in the drawings of the present application.

As stated above, the lower layer 36 of each of the embedded stressor elements 34 is comprised of a first epitaxy doped semiconductor material. The first epitaxy doped semiconductor material has a different lattice constant than the lattice constant of the semiconductor substrate 12 and therefore it is capable of enhancing the electron mobility in the device channel 40. In one embodiment of the invention, and when the semiconductor substrate 12 is composed of silicon and when a pFET gate stack is present, the lower layer 36 of the first epitaxy doped semiconductor material is composed of SiGe or SiGe:C. In another embodiment of the invention, and when the semiconductor substrate 12 is composed of silicon and when an nFET gate stack is present, the lower layer 36 of the first epitaxy doped semiconductor material is composed of silicon carbide (Si:C).

The dopant within the lower layer 36 can be a p-type dopant for a pFET gate stack or an n-type dopant for an nFET gate stack. The term 'p-type dopant' denotes an atom from Group IIIA of the Periodic Table of Elements including for example, B, Al, Ga and/or In. Of these Group IIIB Elements, and in one embodiment of the invention, B is employed. The term 'n-type dopant' denotes an atom from Group VA of the Periodic Table of Elements including for example, P, As and/or Sb. Of these Group VA Elements, and in one embodiment of the invention, P is employed. It is noted that the nomenclature IIIB and VA is from a CAS version of the Periodic Table of Elements.

Notwithstanding the type of dopant within the lower layer 36, the dopant present in the lower layer 36 of first epitaxy doped semiconductor material is in a range from 5E19 atoms/cm$^3$ to 1E21 atoms/cm$^3$ with a dopant concentration from 1E20 atoms/cm$^3$ to 7E20 atoms/cm$^3$ being more typical.

The lower layer 36 of the first epitaxy doped semiconductor material fills a lower portion of each of the recessed regions 30 and can extend upto, but not beyond a lower surface of the extensions regions 28.

The lower layer 36 of each of the embedded stressor elements 34 is formed into the recessed regions 30 utilizing any in-situ doped epitaxial growth process that is well known to those skilled in the art. The epitaxial growth ensures that the lower layer 36 of the first epitaxy semiconductor material is crystalline and has a same crystallographic structure as that of the surface of the semiconductor substrate 12 in which the lower layer 36 is formed. The in-situ doped epitaxial growth process typically employs a precursor gas mixture in which the dopant atoms are present. The types of precursors used in forming the lower layer 36 of the first epitaxy doped semiconductor material are well known to those skilled in the art.

The upper layer 38 of each of the embedded stressor elements 34 is formed on the upper surface of the lower layer 36 as well as on any exposed sidewalls of the semiconductor substrate 12 not including the lower layer 36. The upper layer 38 of each of the embedded stressor elements 34 includes a second epitaxy doped semiconductor material that may include the same or different, preferably the same, epitaxy semiconductor material as the lower layer 36. The upper layer 38 of each embedded stressor element 34 typically has the same lattice constant as lower layer 36. The dopant within the second epitaxy doped semiconductor material is the same conductivity type dopant as that of the first epitaxy doped semiconductor material. The content of dopant within the second epitaxy doped semiconductor material is however greater than the content of dopant within the first epitaxy semiconductor material. Because the lower layer 36 of the first epitaxy doped semiconductor material has a lower content of dopant as compared to the upper layer 38 of the second epitaxy doped semiconductor material, the lower layer 36 is capable of retarding out diffusion of dopants from the upper lower 38. The upper layer 38 of the embedded stressor element 34 can have a dopant concentration from 5E21 atoms/cm$^3$ to 3E22 atoms/cm$^3$, with a dopant concentration from 8E19 atoms/cm$^3$ to 4E20 atoms/cm$^3$ being more typical.

The upper layer 38 can partially or completely fill the remaining portions of each of the recessed regions 30. In one embodiment and as shown, the upper layer 38 is substantially co-planar with an upper surface of the semiconductor substrate 12. In another embodiment (not shown), the upper layer 38 has a top surface that is located below the upper surface of the semiconductor substrate 12. In yet another embodiment (also not shown), the upper layer 38 can extend atop the upper surface of the semiconductor substrate 12.

The upper layer 38 of each of the embedded stressor elements 34 can be formed by a conventional epitaxial growth process including the in-situ doped conformal epitaxy process mentioned above with respect to the first epitaxy semiconductor material of the lower layer 36. Any known precursor can be used in forming the upper layer 38. In some embodiments of the invention, the upper and lower layers of each of the embedded stressor elements 34 can be formed without breaking vacuum between the formation of these layers. In other embodiments, the upper and lower layers of each of the embedded stressor elements 34 are formed by breaking vacuum between each epitaxial growth step.

As mentioned above, at least the upper lower 38 of each of the embedded stressor elements 34 includes at least one monolayer 42 of a dopant (n-type or p-type) located (i.e., embedded) therein that is connected to at least one of the source/drain extensions region 28 of the FET gate stack 18. In some embodiments, of the invention, the lower layer 36 of each of the embedded stressor elements 34 may also include at least one monolayer of an n-type or p-type dopant therein. This particular embodiment is not shown in the drawings of the present application. The dopant within the at least one monolayer 42 matches the dopant within the first and second epitaxy doped semiconductor materials. Thus, for example, when the first and second epitaxy doped semiconductor materials include a p-type, then the monolayer 42 also includes a p-type. Likewise, when the first and second epitaxy doped semiconductor materials include an n-type, then the monolayer 42 also includes an n-type.

The monolayer 42, which includes only dopant atoms, is formed by interrupting the growth of at least the second epitaxy doped semiconductor material and thereafter depositing the monolayer 42 utilizing rapid thermal chemical vapor deposition (RTCVD). The monolayer 42 is a thin layer whose thickness is approximately from 0.5 nm to 3 nm; other thicknesses can also be employed. Once the monolayer 42 is formed growth of the second epitaxy doped semiconductor material can continue. The same procedure can be used in forming monolayers within the lower layer. It is emphasized that multiple monolayers 42 of dopant can be formed within each of the first and second epitaxy doped materials so long as at least one of the monolayers is in direct contact with an edge of at least one of the extension regions 28.

It is observed that when CMOS devices are to be fabricated, one type of embedded stressor element can be formed into the pFET device region, while another type of embedded stressor element can be formed into the nFET device region. This can be achieved by following the procedure mentioned above for forming one type of embedded stressor element in one of the device regions (pFET or nFET device region), while utilizing a block mask over the other device region. The block mask can be removed and a second block mask can be formed atop the device region that includes the one type of embedded stressor element. The above procedure can then be repeated to form another type of embedded stressor element within the device region not protected by the second block mask.

It is thus emphasized that the present disclosure provides an embedded stressor element for an nFET and/or an embedded stressor element for a pFET.

Figure 4:
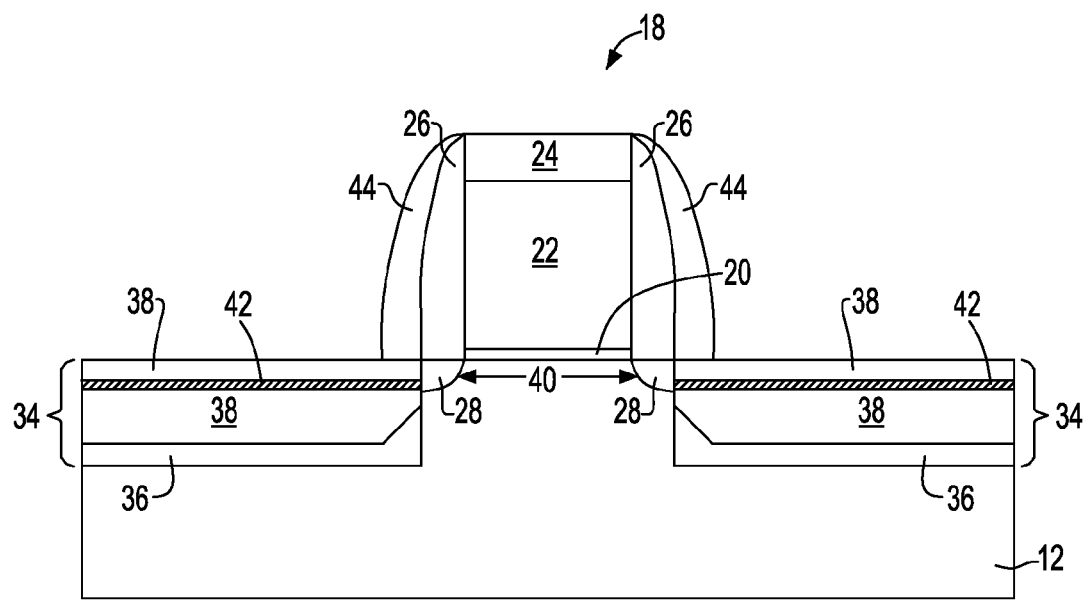
FIG. 4 is a pictorial representation (through a cross sectional view) depicting the structure of FIG. 3 after forming a semiconductor material cap on an upper surface of the embedded stressor element.

Referring now to FIG. 4 there is shown the structure of FIG. 3 after further CMOS processing including formation of another spacer 44 (which can be referred to herein as an outer spacer relative to spacer 26) and formation of a source region and drain region (not specifically shown in the drawings of the present application). The source region and the drain region are collectively referred to herein as source/drain regions. The source/drain regions are typically formed within the upper layer 38 of each of the embedded stressor elements. In some embodiments of the invention and prior to the formation of the another spacer 44, the optional gate electrode cap 24 can be removed from the structure. The removal of the optional gate electrode cap 24 can be performed utilizing an etchant that selectively removes the gate electrode cap material relative to the at least one spacer 26, the underlying gate electrode 22 and the upper surface of the upper layer 38 of the embedded stressor element. An example of such an etchant includes, but is not limited to reactive ion etching.

Spacer 44 is formed utilizing the same or different process as used in forming the at least one spacer 26. Spacer 44 can be comprised of the same or different dielectric material as the at least one spacer 26. In one embodiment, spacer 44 is composed of a different dielectric material as compared to the at least one spacer 26. In one embodiment, spacer 44 is a spacer defining silicide proximity. Spacer 44 can be formed by a conventional silicide process and etching.

In some embodiments, and prior to the formation of spacer 44, the at least one spacer 26 can be removed and spacers 42 is formed in direct contact with sidewalls of the at least one FET gate stack 18. In the illustrated embodiment, a lateral edge of spacer 44 is in direct contact with a sidewall of the at least one spacer 26.

After formation of spacer 44, source/drain regions are formed into at least the upper layer 38 of each of the embedded stressor elements. The source/drain regions are formed utilizing a source/drain ion implantation process followed by annealing. Spacer 44 serves as an ion implantation mask.

Figure 5:
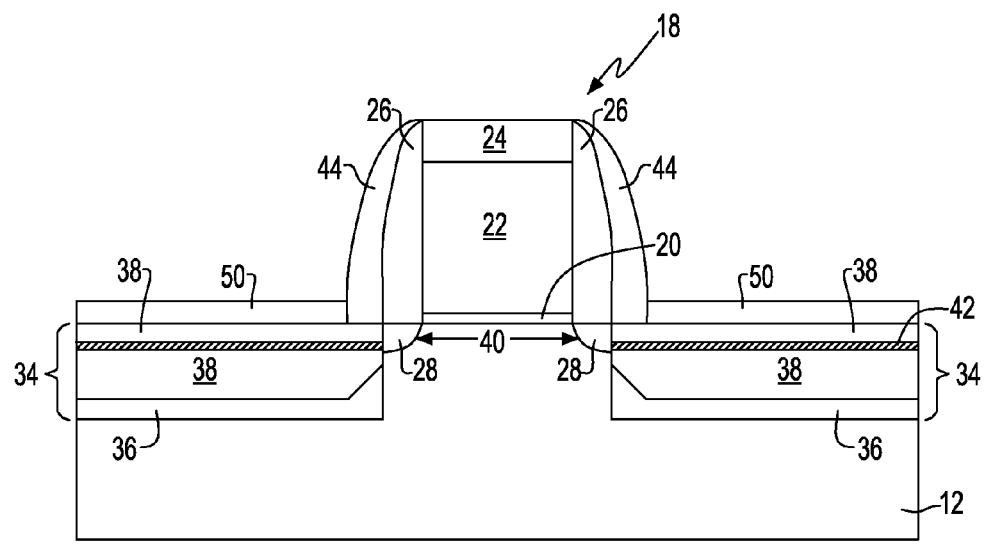
FIG. 5 is a pictorial representation (through a cross sectional view) depicting the structure of FIG. 4 after further CMOS processing steps including spacer formation and formation of a source region and a drain region, collectively referred to herein as source/drain regions.

Referring now to FIG. 5 there is illustrated the structure of FIG. 4 after forming a semiconductor cap 50 atop the uppermost surface of upper layer 38. The semiconductor cap 50 includes a semiconductor material that has a same lattice constant as that of the semiconductor substrate 12. Thus, and in one embodiment of the invention, the semiconductor cap 50 and the semiconductor substrate 12 are both composed of Si. The semiconductor cap 50 is formed utilizing a non-doped epitaxy growth process.

Further CMOS processing including formation of metal semiconductor alloy contacts (not shown) can now be performed. The metal semiconductor alloy contacts are formed utilizing any process that is capable of forming a metal semiconductor alloy atop a semiconductor material. In one embodiment of the invention, the metal semiconductor alloy contacts are formed utilizing a silicide process. The silicide process can be self-aligned to the outer edge of the another spacer 44. The silicide process includes forming a metal capable of forming a metal semiconductor alloy when reacted with a semiconductor material. The metal used in forming the metal semiconductor alloy contact regions can include, but are not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the gate electrode 22, when the optional gate electrode cap 24 is removed and the gate electrode 22 is composed of a Si-containing material.

Figure 6:
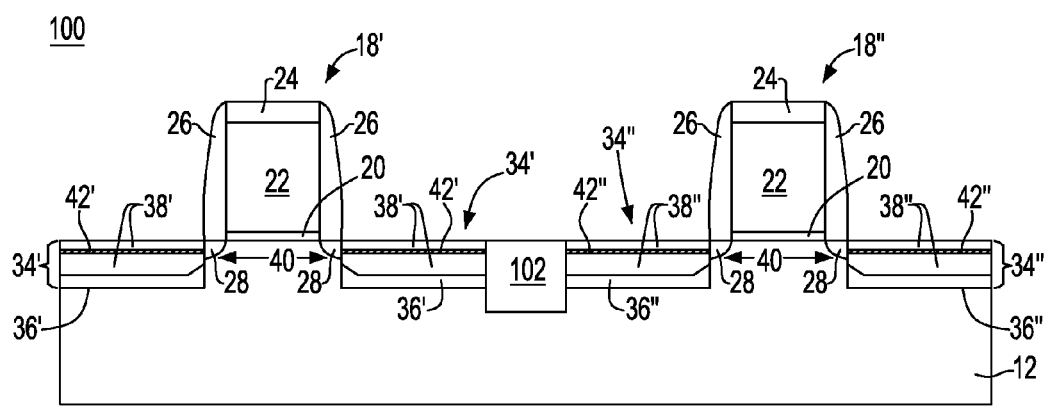
FIG. 6 is a pictorial representation (through a cross sectional view) depicting a CMOS structure that can be formed by employing the basic processing steps shown in FIGS. 1-5.

Reference is now made to FIG. 6 which illustrates a CMOS structure 100 that can be formed utilizing the basic processing steps mentioned above. Specifically, the CMOS structure 100 illustrated in FIG. 6 includes at least one pFET gate stack 18' and at least one nFET gate stack 18" located on an upper surface of a semiconductor substrate 12. An isolation region 102 is present between the at least one pFET gate stack 18' and the at least one nFET gate stack 18".

Each of the at least one pFET gate stack 18' and the at least one nFET gate stack 18" includes a gate dielectric 20, a gate electrode 22 and an optional dielectric cap 24 as mentioned above. Spacers 26 can also be present on sidewalls of each of the gate stacks. Each of the FET gate stacks further includes a source extension region and a drain extension region (collectively referred to as extension regions 28) located within the semiconductor substrate 12 at a footprint of both the at least one pFET gate stack 18' and the at least one nFET gate stack 18". A device channel 40 is located between the extension regions 28 of each of the FET gate stacks. pFET embedded stressor elements 34' are located on opposite sides of the at least one pFET gate stack 18' and within the semiconductor substrate 12, and nFET embedded stressor elements 34" are located on opposite sides of the at least one nFET gate stack 18" and within the semiconductor substrate 12. Each of the embedded stressor elements includes a lower layer (36', 36") of a first epitaxy doped semiconductor material having a lattice constant that is different from a lattice constant of the semiconductor substrate 12 and imparts a strain in the device channel 40, and an upper layer (38', 38") of a second epitaxy doped semiconductor material located atop the lower layer, wherein the lower layer of the first epitaxy doped semiconductor material has a lower content of dopant as compared to the upper layer of the second epitaxy doped semiconductor material. At least one monolayer (42', 42") of dopant are located within the upper layer of each of the embedded stressor elements, the at least one monolayer of dopant is in direct contact with an edge of the extension regions 28. A semiconductor material cap as shown in FIG. 5 can also be formed atop each of the embedded stressor elements (34', 34") shown in FIG. 6.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a structure comprising:
forming at least one FET gate stack on an upper surface of a semiconductor substrate;
forming a source extension region and a drain extension region within the semiconductor substrate at the footprint of the at least one FET gate stack;
forming recessed regions on opposite sides of the at least one FET gate stack and within the semiconductor substrate; and
forming embedded stressor elements substantially within the recessed regions, wherein each of the embedded stressor elements includes a lower layer of a first epitaxy doped semiconductor material having a lattice constant that is different from a lattice constant of the semiconductor substrate and imparts a strain in the device channel, an upper layer of a second epitaxy doped semiconductor material located atop the lower layer, wherein the lower layer of the first epitaxy doped semiconductor material has a lower content of dopant as compared to the upper layer of the second epitaxy doped semiconductor material, and at least one monolayer of dopant located within the upper layer, the at least one monolayer of dopant is in direct contact with an edge of either the source extension region or the drain extension region.

2. The method of claim 1 wherein the lower and the upper layer of the embedded stressor elements are both formed by an in-situ doped epitaxial growth process.

3. The method of claim 1 wherein the at least one monolayer of dopants is formed by atomic layer deposition, the atomic layer deposition occurs by interrupting growth of the upper layer of the second epitaxy doped semiconductor material.

4. The method of claim 1 wherein the at least one FET gate stack is a pFET gate stack, the lower layer of each of the embedded stressor elements includes SiGe or SiGe:C, the first and second epitaxy doped semiconductor materials include a p-type dopant, and the monolayer of dopants is also p-type.

5. The method of claim 1 wherein the at least one FET gate stack is an nFET gate stack, the lower layer of each of the embedded stressor elements includes Si:C, the first and second epitaxy doped semiconductor materials include an n-type dopant, and the monolayer of dopants is also n-type.

* * * * *